United States Patent
Koshio (10) Patent No.: US 6,198,161 B1
(45) Date of Patent: Mar. 6, 2001

(54) SEMICONDUCTOR DEVICE (75) Inventor: Yasuhiro Koshio, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/391,660

(22) Filed: Sep. 7, 1999

(30) Foreign Application Priority Data

Nov. 27, 1998 (JP) .................................................. 10-337606

(51) Int. Cl.⁷ .................................................... H01L 23/00
(52) U.S. Cl. .......................... 257/678; 257/676; 257/684; 257/688; 257/693
(58) Field of Search ........................... 257/678, 717–725, 257/676, 684, 688, 693

(56) References Cited

FOREIGN PATENT DOCUMENTS 8-111583    4/1996   (JP) .

Primary Examiner—Fetsum Abraham (74) Attorney, Agent, or Firm—Finnegan, Henderson, Farabow, Garrett & Dunner, L.L.P.

(57) ABSTRACT

This semiconductor device comprises a semiconductor package having a first wiring substrate and a semiconductor element disposed or mounted thereon, a mounting second wiring substrate, and a protrusion electrode terminal and a receiving terminal portion for connecting an external connecting terminal of the semiconductor package and an external connecting terminal of the second mounting wiring substrate. The protrusion electrode terminal coated with a conductor layer is disposed on the external connecting terminal of the semiconductor package. An aggregated electrode layer having a plurality of fiber electrodes that are bound or tangled is disposed on the external connecting terminal of the mounting wiring substrate. The protrusion electrode terminal on the semiconductor package side is detachably inserted into the aggregated electrode layer on the mounting wiring substrate side. Thus, the protrusion electrode terminal and the aggregated electrode layer are mechanically secured and electrically connected. Consequently, the semiconductor device has high mounting reliability without need to use solder. Thus, the cost of the material of the semiconductor device can be reduced and the number of fabrication steps thereof can be decreased.

6 Claims, 6 Drawing Sheets

SEMICONDUCTOR DEVICE

BACKGROUND OF THE INVENTION

1. Field of the Invention

The present invention relates to a semiconductor device, in particular, to a semiconductor device of which a semiconductor package is flexibly mounted and electrically connected to a wiring substrate.

2. Description of the Related Art

To mount a semiconductor package on a wiring substrate as a motherboard, a solder layer composed of for example Sn—Pb should be formed on at least one of the semiconductor package side and the wiring substrate side by a plating method, a printing method, or the like. Thereafter, the solder layer should be heated and melted (re-flowed). With the melted solder as an adhesive agent, the semiconductor package and the wiring substrate are mechanically and electrically connected.

However, such a mounting method for a semiconductor package has the following problems. To heat and melt the solder layer, since an expensive unit referred to as re-flow furnace is used, the cost of the fabrication facility is high. In addition, when solder is re-flowed, since the semiconductor package is exposed to a high temperature environment, the quality of the resultant semiconductor device against high temperature should be assured. Thus, a heat resisting material that is expensive should be used. Moreover, since the solder contains lead that is harmful to human bodies, it should be used and discharged with special attention against protection of environmental contamination.

SUMMARY OF THE INVENTION

The present invention is achieved to remedy the disadvantages described above. The invention aims to provide a semiconductor device that has mounting reliability equal to or higher than a conventional one without need to use an expensive facility such as a re-flow furnace and that allows the material cost and the number of fabrication steps to reduce and decrease.

The present invention is a semiconductor device, comprising a semiconductor package having a first wiring substrate having a first region and a second region, a first connecting terminal formed on the first region, a second connecting terminal formed on the second region and connected to the first connecting terminal, and a semiconductor element mounted in the first region of the wiring substrate and connected to the first connecting terminal, a second wiring substrate having an external connecting terminal disposed opposite to the second connecting terminal of the wiring substrate of the semiconductor package, and connecting means for connecting the second connecting terminal of the first wiring substrate and the external connecting terminal of the second wiring substrate, the connecting means having a protrusion electrode terminal at least whose surface is coated with a conductor layer, and a receiving terminal portion at least whose surface is coated with a conductor layer, the receiving terminal portion being detachable fitted and electrically connected to the protrusion electrode terminal.

According to one aspect of the present invention, the first substrate used in the semiconductor package is for example a wiring substrate of which a wiring layer composed of for example Cu, Cu alloy, or aluminum is formed on at least one main surface (namely, one surface or two surfaces) of an insulation substrate (such as a glass cloth—epoxy resin impregnated substrate) or an insulation resin film (such as a polyimide resin film or a polyethylene terephthalate film (PET film)). The wiring layer contains a first connecting terminal, a second connecting terminal, and a wiring portion. The first connecting terminal is connected to the semiconductor element. The second connecting terminal is connected to a second wiring substrate (that will be described later). The wiring portion connects the first connecting terminal and the second connecting terminal.

The second wiring substrate that is a mother board on which the semiconductor package is disposed or mounted is a rigid wiring substrate having a wiring layer formed on at least one main surface of an insulation substrate such as a glass cloth—resin impregnated substrate or a ceramic substrate. The wiring layer of the second wiring substrate contains an external connecting terminal (third connecting terminal) connected to the semiconductor package.

According to one aspect of the present invention, the second connecting terminal of the first wiring substrate, which is used in the semiconductor package, and the external connecting terminal (third connecting terminal) of the second wiring substrate (mounting substrate) are mechanically connected with a protrusion electrode terminal disposed on one of the second and third connecting terminals and a receiving terminal portion disposed on the other connecting terminal. The protrusion electrode terminal and the receiving terminal portion are detachably fitted. In addition, since the conductor layers on the surfaces of the protrusion electrode terminal and the receiving terminal portion contact each other, their electrical connections are secured.

Such a connecting means is accomplished by a combination of a protrusion electrode terminal and a receiving terminal portion. Thus, the protrusion electrode terminal may be disposed on either the first wiring substrate side or the second wiring substrate side. The receiving terminal portion is for example an aggregated electrode layer having a plurality of fiber electrodes that are bound or tangled.

The receiving terminal portion may have a protrusion receiving electrode terminal. In addition, the shape of the protrusion electrode terminal may be almost the same as the shape of the receiving electrode terminal. In other words, the protrusion electrode terminal may have a cylinder portion (for example, a circular cone portion) and a disk portion formed at an edge thereof. The receiving terminal portion may have a receiving electrode terminal in the same shape as the protrusion electrode terminal. In this case, with the protrusion electrode terminal and the receiving electrode terminal that fit or contact each other, their mechanical/electrical connections are secured.

The receiving terminal portion may be a multilayered electrode portion having a plurality of aggregated electrode layers that are piled up in the direction of the thickness thereof. When the aggregated electrode layers of the multilayered electrode portion fit respective protrusion electrode terminals that have different heights, the multilayered electrode portion is three-dimensional connections with a plurality of protrusion electrode terminals having different heights.

In the semiconductor device according to the present invention, with a protrusion electrode terminal disposed at one of an external connecting terminal (second connecting terminal) of a semiconductor package and an external connecting terminal of a second wiring substrate (motherboard) and a receiving terminal portion disposed at the other connecting terminal that detachably fit each other, they are mechanically connected with predetermined strength. In addition, their electrical connections are properly performed. Thus, they are connected without need to have a heating step at high temperature. In other words, they can be connected at room temperature. The semiconductor package can be repaired at room temperature.

In a conventional semiconductor device of which a semiconductor package is connected to a wiring substrate through a solder layer, the solder joint portion deteriorates with a temperature cycle. In contrast, according to the present invention, since a semiconductor package and a wiring substrate are connected with sufficient flexibility without need to use solder, the stress concentration to the connecting portion due to a periodic heat load or the like is suppressed. Thus, the connecting portion does not almost deteriorate. In addition, since solder containing lead harmful to human bodies is not used as a structural material of the semiconductor device, the present invention is effective from a view point of protection of environmental contamination.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, preferred embodiments of the present invention will be described.

(Embodiment 1)

Figure 1:
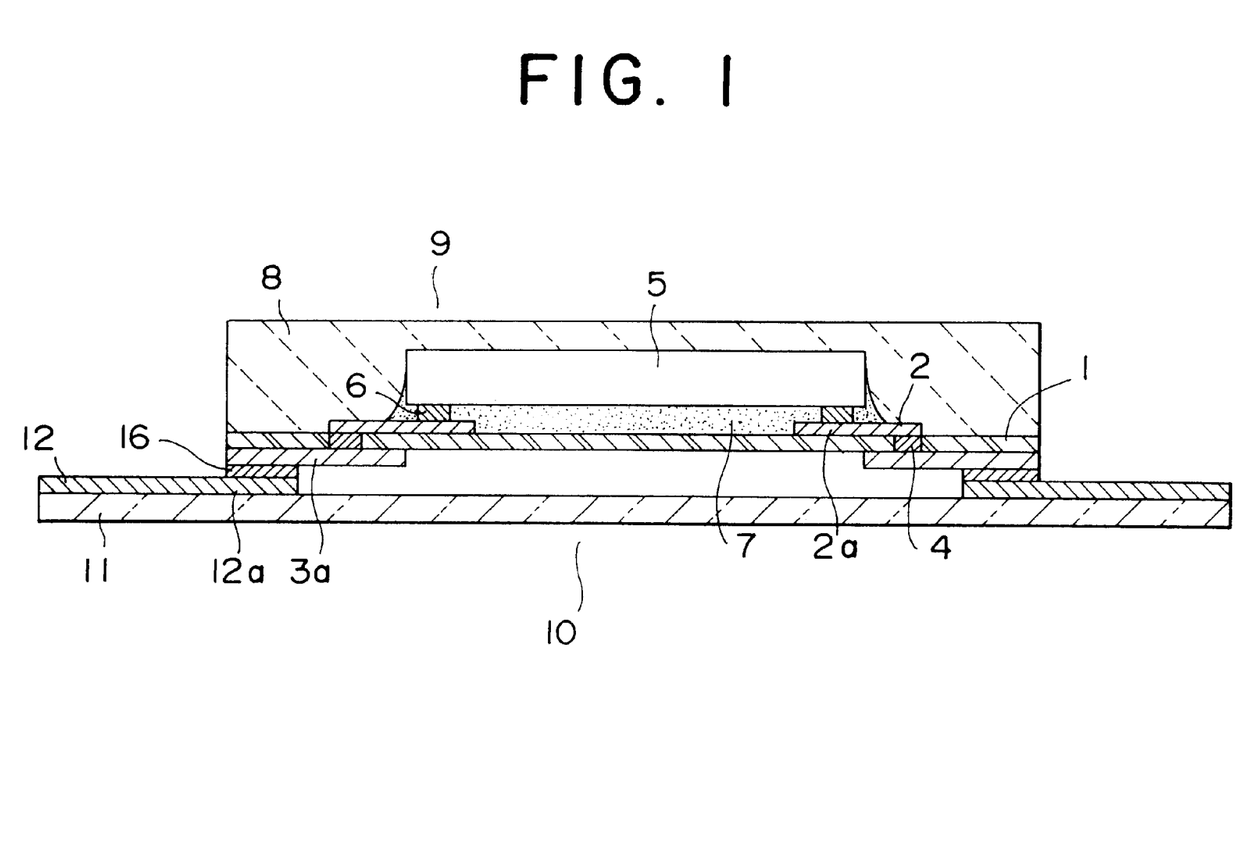
FIG. 1 is a sectional view showing the structure of a semiconductor device according to a first embodiment of the present invention.
Figure 2:
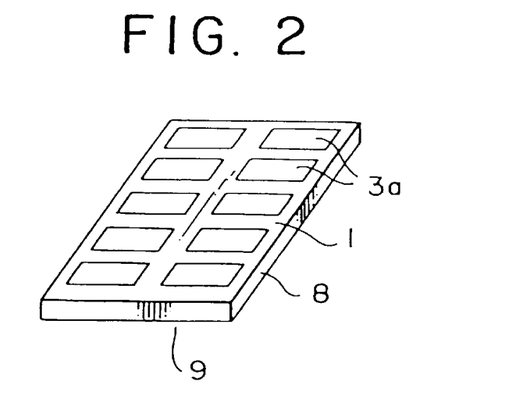
FIG. 2 is a perspective rear view showing the structure of a semiconductor package of the semiconductor device according to the first embodiment.
Figure 3A:
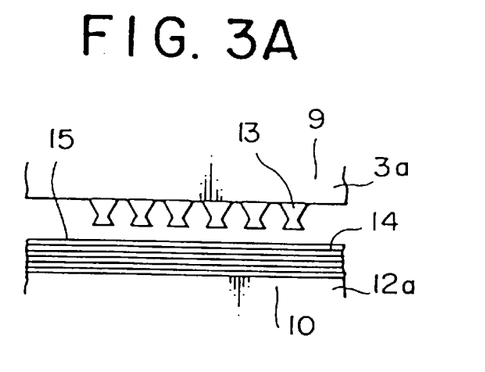
FIG. 3A is a sectional view showing a connecting portion of the semiconductor device according to the first embodiment in the state that protrusion electrode terminals are separated from an aggregated electrode layer.
Figure 3B:
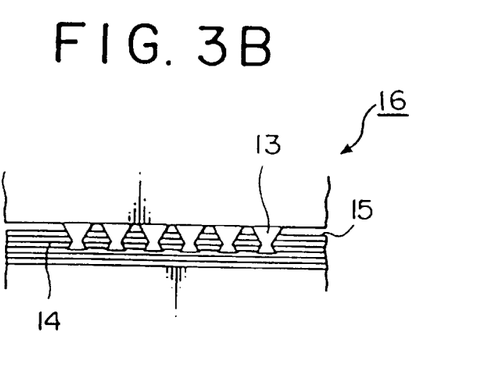
FIG. 3B is a sectional view showing the connecting portion of the semiconductor device according to the first embodiment in the state that the protrusion electrode terminals are fitted to the aggregated electrode layer.

FIG. 1 is a sectional view showing the structure of a semiconductor device according to a first embodiment of the present invention. FIG. 2 is a rear perspective view showing the structure of a semiconductor package of the semiconductor device according to the first embodiment of the present invention. FIGS. 3A and 3B are enlarged sectional views showing a connecting portion of the semiconductor package and a mounting wiring substrate of the semiconductor device according to the first embodiment.

In FIGS. 1, 2, and 3, reference numeral 1 is an insulation substrate such as a glass cloth—epoxy resin impregnated substrate. A wiring layer 2 that contains connecting pads 2a connected to a semiconductor element is disposed on one surface (upper surface) of the insulation substrate 1. External connecting pads 3a are disposed on the other surface of the insulation substrate 1. The wiring layer 2 and the external connecting pads 3a are electrically connected through via-holes 4 formed at predetermined positions of the insulation substrate 1.

The semiconductor element 5 is mounted with a face down at a predetermined position on the upper surface of the wiring substrate. Electrode terminals of the semiconductor element 5 and the connecting pads 2a of the wiring substrate are connected through gold (Au) bumps 6 (flip-chip bonded). The connected portion is sealed and encapusulated with epoxy resin or the like. Thus, an under-fill 7 is formed. In addition, a mold resin layer 8 is formed outside the under-fill 7 and the semiconductor element 5. The mold resin layer 8 is mainly composed of epoxy resin or the like. Thus, a semiconductor package 9 is formed.

Reference numeral 10 is a mounting wiring substrate of which a wiring layer 12 containing package connecting pads 12a is formed on one surface of an insulation substrate 11 such as a glass cloth—epoxy resin impregnated substrate. The semiconductor package 9 is disposed on the mounting wiring substrate 10. External connecting pads 3a of the semiconductor package 9 are disposed opposite to the package connecting pads 12a of the accommodating wiring substrate 10. The external connecting pads 3a and the package connecting pads 12a are mechanically and electrically connected by a connecting means (that will be described later).

Figure 4:
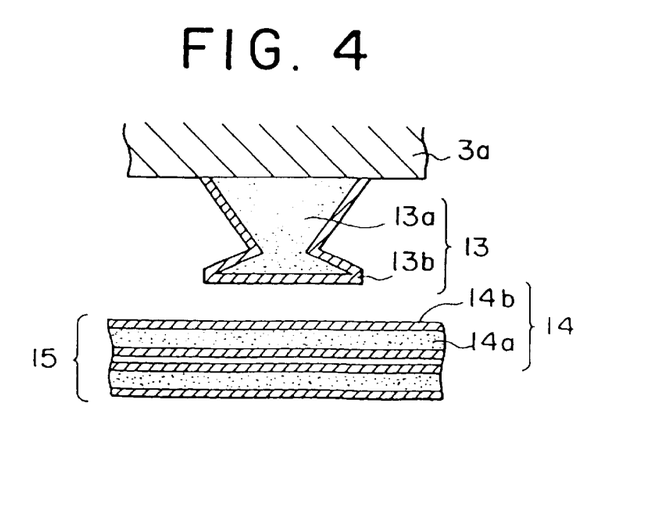
FIG. 4 is an enlarged sectional view showing the structures of a protrusion electrode terminal and a fiber electrode that composes the aggregated electrode layer of the connecting portion according to the first embodiment.

As shown in FIG. 4, protrusion electrode terminals 13 are disposed corresponding to the external connecting pads 3a on the rear side of the semiconductor package 9. A plurality of protrusion electrode terminals 13 are disposed on each external connecting pad 3a. Each of the protrusion electrode terminals 13 has a structure of which a conductor layer 13b is formed on the surface of an insulation terminal body 13a. Alternatively, one protrusion electrode terminal 13 may be disposed on one external connecting pad 3a. Each of the protrusion electrode terminals 13 has a circular cone portion and a disc portion formed at an edge thereof. Thus, although the protrusion electrode terminals 13 are easily inserted into the aggregated electrode layer(that will be described later), they do not easily come off from the aggregated electrode layer because the fiber electrodes thereof tangle the protrusion electrode terminals 13.

The aggregated electrode layer 15 is disposed on the connecting pads 12a of the mounting wiring substrate 10. The aggregated electrode layer 15 comprises a plurality of fiber electrodes 14 that are bound or tangled. Each of the fiber electrodes 14 is composed of an insulation electrode body 14a and a conductor layer 14b formed thereon. Alternatively, the connecting pads 12a of the mounting wiring substrate 10 may be composed of the above-mentioned aggregated electrode layer 15.

The protrusion electrode terminals 13 disposed on the semiconductor package 9 side are inserted into the aggregated electrode layer 15 on the mounting wiring substrate 10 side. Thus, the protrusion electrode terminals 13 are mechanically secured to the aggregated electrode layer 15. In addition, since the conductor layer 13b formed on the surface of the protrusion electrode terminals 13 contacts the conductor layer 14 formed on the surface of the fiber electrodes 14 of the aggregated electrode layer 15, they are electrically connected. In FIG. 1, reference numeral 16 is an electric/mechanical connecting portion of which the protrusion electrode terminals fit the aggregated electrode layer.

According to the first embodiment, since the protrusion electrode terminals 13 fit the aggregated electrode layer 15 having a plurality of fiber electrodes 14, the external connecting pads 3a of the semiconductor package 9 and the connecting pads 12a of the mounting wiring substrate 10 are mechanically and electrically connected. Thus, the semiconductor package 9 can be mounted and repaired at room temperature. In addition, since the connecting portions 16 of the semiconductor package 9 and the mounting wiring substrate 10 are free of solder, it is not necessary to use an expensive facility such as a re-flow furnace. Thus, the cost of the material can be reduced and the heating step can be omitted. In addition, the mounting reliability equal to or higher than that of the conventional semiconductor device can be obtained. Moreover, since the connecting portion 16 is flexible to some extent, the stress concentration to the connecting portion 16 due to a periodic heat load can be alleviated. Thus, the resultant semiconductor device is almost free from deterioration with a temperature cycle.

Next, second and third embodiments of the present invention will be described.

(Embodiment 2 and 3)

Figure 5:
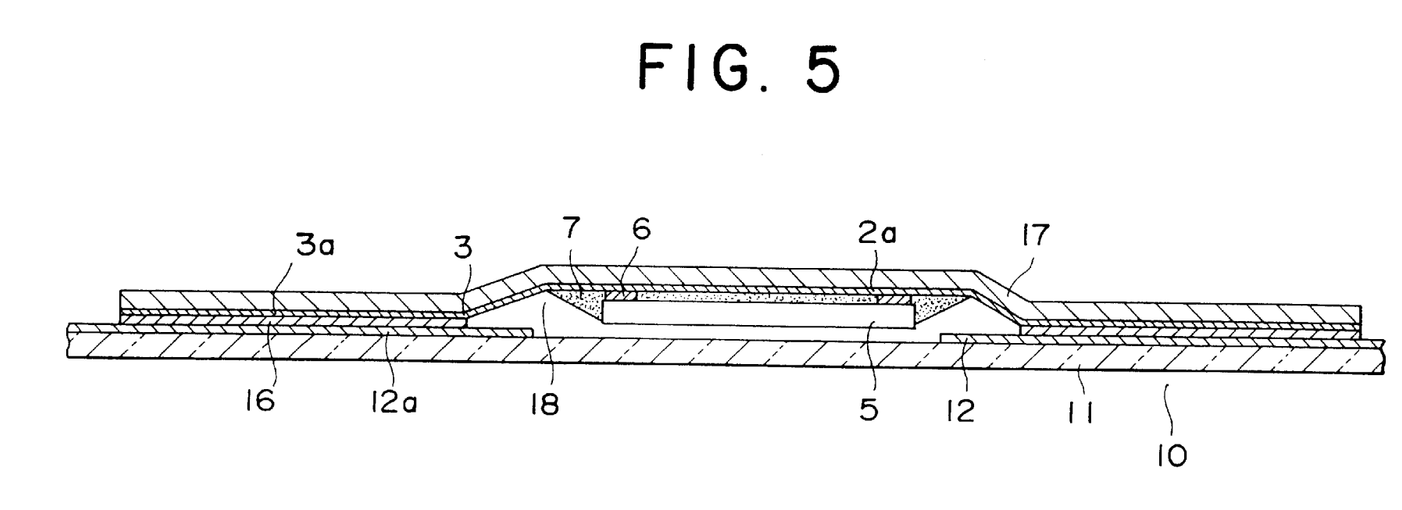
FIG. 5 is a sectional view showing the structure of a semiconductor device according to a second embodiment of the present invention.

FIG. 5 is a sectional view showing the structure of a semiconductor device according to a second embodiment of the present invention. In FIG. 5, reference numeral 17 is an insulation resin film such as a polyimide resin film or a PET film. Connecting pads 2a are disposed at a center portion (first region) on one surface of the insulation resin film 17. The connecting pads 2a are connected to a semiconductor element. A wiring layer 3 containing external connecting pads 3a is disposed in a second region around the first region. A semiconductor element 5 is mounted with a face down in the first region of the wiring film. Electrode terminals of the semiconductor element 5 are connected to the connecting pads 2a of the wiring film through Au bumps 6. The connected portion is sealed and encapsulated with a resin such as epoxy resin, and an under-fill 7 is formed. Thus, a semiconductor package 18 is formed.

The semiconductor package 18 is disposed on a mounting wiring substrate 10 in such a manner that the insulation resin film 17 faces upward. A wiring layer 12 containing connecting pads 12a is formed on one surface of the mounting wiring substrate 10. External connecting pads 3a formed in the second region of the insulation resin film 17 and the connecting pads 12a of the mounting wiring substrate 10 are electrically and mechanically connected through a connecting portion 16 structured in the same manner as the first embodiment. In other words, protrusion electrode terminals 13 formed on the external connecting pads 3a of the insulation resin film 17 are inserted into an aggregated electrode layer 15 formed on the connecting pads 12a of the mounting wiring substrate 10. The protrusion electrode terminals 13 detachably fit the aggregated electrode layer 15. In addition, the protrusion electrode terminals 13 and the aggregated electrode layer 15 are electrically connected.

Figure 6:
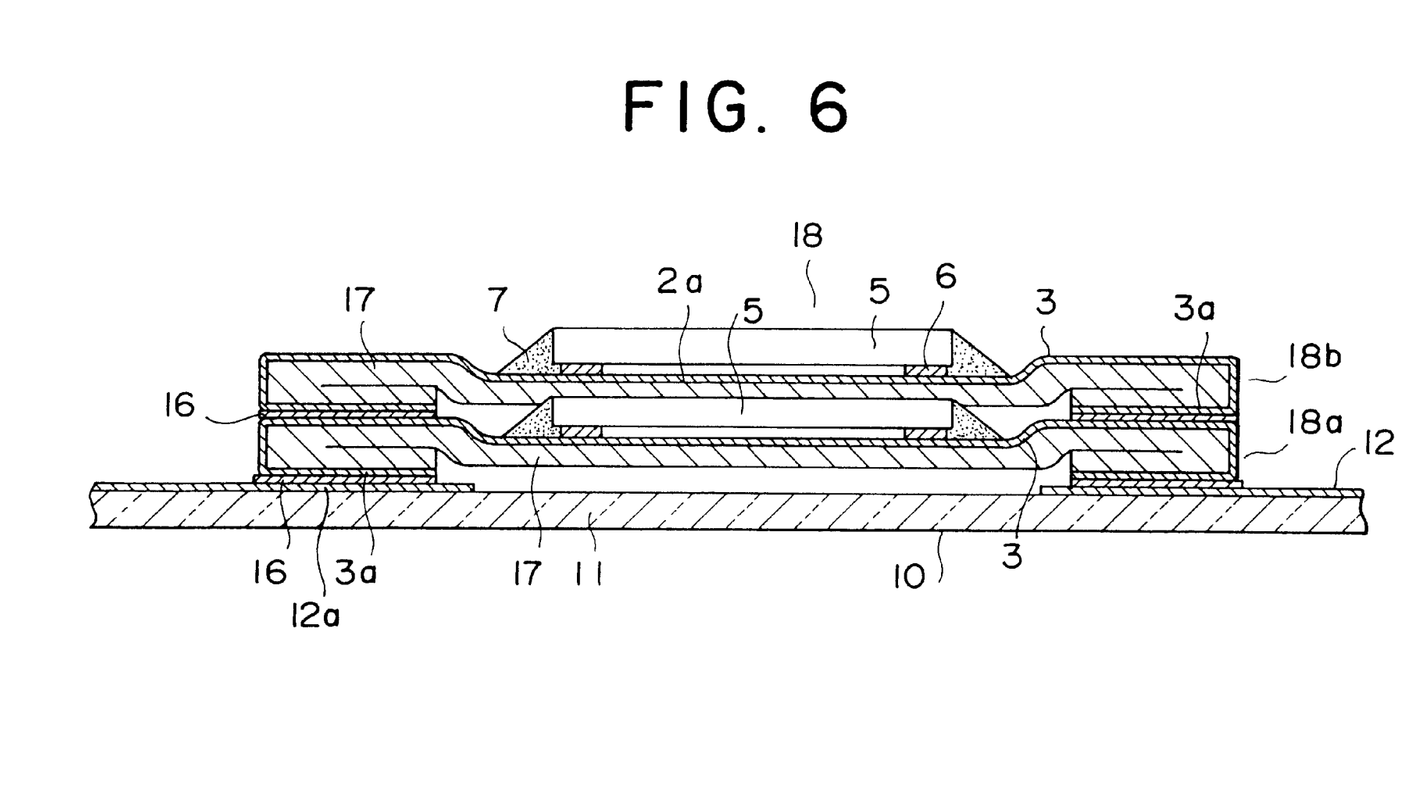
FIG. 6 is a sectional view showing the structure of a semiconductor device according to a third embodiment of the present invention.

FIG. 6 is a sectional view showing the structure of a semiconductor device according to a third embodiment of the present invention. According to the third embodiment, a plurality of semiconductor packages 18 that have the same structure as the semiconductor package according to the second embodiment are successively disposed or mounted on a mounting wiring substrate 10. Referring to FIG. 6, two semiconductor packages 18 are successively disposed on the mounting wiring substrate 10. In other words, each of the semiconductor packages 18 is disposed in such a manner that an insulation resin film 17 faces downwardly. A second region of the insulation resin film 17 on which external connecting pads 3a are disposed is downwardly bent. As with the first and second embodiments, an electric/mechanic connecting portion 16 is disposed between the external connecting pads 3a of the lower semiconductor package 18a and package connecting pads 12a of the mounting wiring substrate 10. The electric/mechanic connecting portion 16 comprises protrusion electrode terminals 13 and an aggregated electrode layer 15. In addition, a connecting portion 16 is disposed between the external connecting pads 3a of the upper semiconductor package 18b and the external connecting pads 3a of the lower semiconductor package 18a. Likewise, the connecting portion 16 comprises the protrusion electrode terminals 13 and the aggregated electrode layer 15.

According to the second and third embodiments, since the protrusion electrode terminals fit the aggregated electrode layer, the external connecting pads 3a of the semiconductor package 18 and the package connecting pads 12a of the mounting wiring substrate 10 are mechanically and electrically connected. Thus, the semiconductor package(s) can be mounted and repaired at room temperature. In addition, as a connecting means for the semiconductor package(s) 18 and the mounting wiring substrate 10, since solder is not used, it is not necessary to use an expensive facility such as a re-flow furnace. Thus, the cost of the material can be reduced and the heating step can be omitted. Moreover, the connecting portion 16 of the protrusion electrode terminals 13 and the aggregated electrode layer 15 allows the stress concentration due to a periodic heat load or the like to be properly alleviated. Thus, the resultant semiconductor device is almost free from deterioration with a temperature cycle.

According to the third embodiment, since a plurality of semiconductor packages 18 are successively (densely) disposed in the direction of the thickness thereof, the space factor is high. Consequently, a semiconductor device that is compact and that has high performance can be obtained.

Next, a fourth embodiment of the present invention will be described.

(Embodiment 4)

Figure 7:
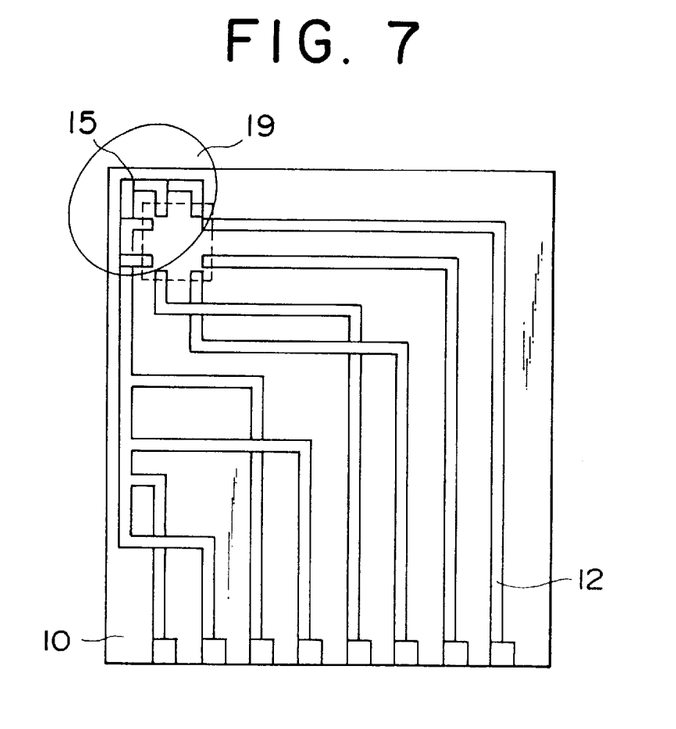
FIG. 7 is a plan view showing a mounting wiring substrate (a second wiring substrate) of a semiconductor device according to a fourth embodiment of the present invention.
Figure 8:
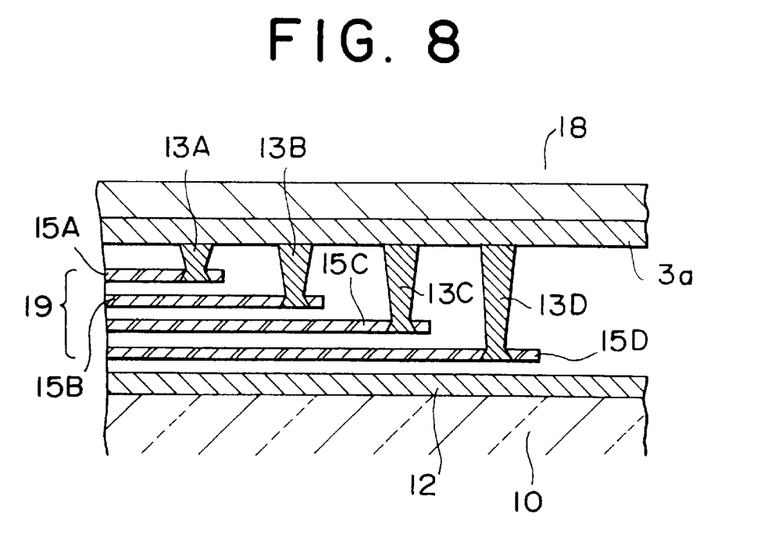
FIG. 8 is an enlarged sectional view showing a connecting portion of the semiconductor device according to the fourth embodiment of the present invention.

FIGS. 7 and 8 are a plan view and a sectional view showing the structure of a semiconductor device according to the fourth embodiment of the present invention. Referring to FIGS. 7 and 8, a multilayered electrode portion 19 is disposed in a forming area of a wiring layer 12 of a mounting wiring substrate 10. The multilayered electrode portion 19 has a plurality of aggregated electrode layers 15. Each of the aggregated electrode layers 15 has a plurality of fiber electrodes. In the multilayered electrode portion 19, the aggregated electrode layers 15 are successively disposed in the direction of the thickness thereof. A plurality of protrusion electrode terminals 13A, 13B, 13C, and 13D with four different heights are formed on an external connecting pad 3a on the semiconductor package 18 side.

The semiconductor package 18 is disposed in a forming region of the multilayered electrode portion 19 of the mounting wiring substrate 10 in such a manner that the mounting surface of the semiconductor element 5 faces the mounting wiring substrate 10. The protrusion electrode terminals 13A, 13B, 13C, and 13D are inserted into the aggregated electrode layers 15A, 15B, 15C, and 15D, respectively. Since the fiber electrodes of the aggregated electrode layers 15 tangle the edge portions of the protrusion electrode terminals 13, the protrusion electrode terminals 13 and the aggregated electrode layers 15 are mechanically and electrically connected. Since other portions in the fourth embodiment are structured in the same manner as the second embodiment, their description is omitted. In FIG. 7, a square portion represented with dotted lines is a mounting region of the semiconductor package 18.

According to the fourth embodiment of the present invention, since the protrusion electrode terminals 13 fit the aggregated electrode layers 15, the external connecting pads 3a of the semiconductor package 18 and the package connecting pads 12a of the mounting wiring substrate 10 are mechanically and electrically connected. Thus, the semiconductor package 18 can be mounted and repaired at room temperature. The mounting wiring substrate 10 has the multilayered electrode portion 19 of which the plurality of aggregated electrode layers 15 are piled up. The protrusion electrode terminals 13 with different heights are inserted into the relevant aggregated electrode layers 15 of the multilayered electrode portion 19. Thus, since three-dimensional connections can be easily performed, the wiring design of the semiconductor device can be easily performed. Moreover, as a connecting means of the semiconductor package 18 and the mounting wiring substrate 10, since solder is not used, it is not necessary to use an expensive facility such as a re-flow furnace. Thus, the cost of the material can be reduced and the heating step can be omitted. In addition, the connected portion is almost free from deterioration with a temperature cycle.

It should be noted that the present invention is not limited to the above-described embodiments. In other words, according to the first to fourth embodiments of the present invention, the protrusion electrode terminals 13 are disposed on the semiconductor package 9 (19) side. The aggregated electrode layer(s) 15 is (are) disposed on the mounting wiring substrate 10 side. Alternatively, the aggregated electrode layer(s) 15 may be disposed on the semiconductor package 9 (18) side. Thus, the protrusion electrode terminals 13 may be disposed on the mounting wiring substrate 10 side. Moreover, the aggregated electrode layer(s) 15 may have fiber electrodes and insulation fiber members, rather than only the fiber electrodes 14. In addition, at least either the fiber electrodes 14 or the protrusion electrode terminals 13 may be composed of only a conductor.

In the semiconductor device according to each of the first to fourth embodiments of the present invention, as a mechanism for connecting the external connecting pads 3a of the semiconductor package 9 (18) and the connecting pads 12a of the mounting wiring substrate 10, the protrusion electrode terminals 13 and the aggregated electrode layer(s) 15 are used in combination. However, as long as the receiving terminal portion that receives the protrusion electrode terminals 13 tangles, fits, and secures the protrusion electrode terminals 13, the shape and structure of the receiving terminal portion are not limited.

(Embodiment 5)

Figure 9:
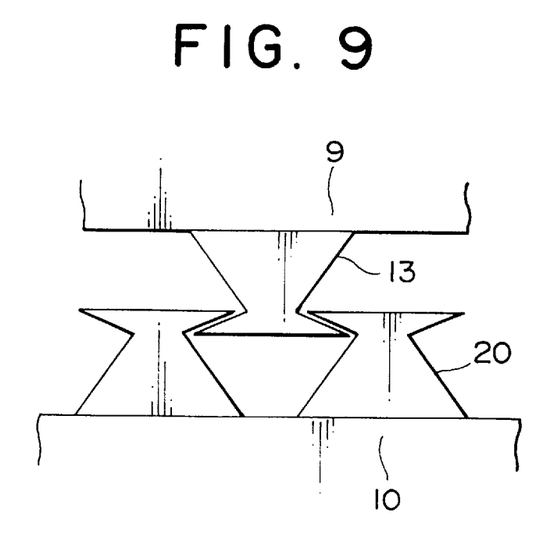
FIG. 9 is an enlarged sectional view showing the structures of a protrusion electrode terminal and a receiving terminal portion of a semiconductor device according to a fifth embodiment of the present invention.

FIG. 9 is a sectional view showing the structures of a receiving terminal portion 20 and a protrusion electrode terminal 13 of a semiconductor device according to a fifth embodiment of the present invention. Referring to FIG. 9, the receiving terminal portion 20 has the same shape as a protrusion electrode terminal 13 having a circular cone portion and a disc portion formed at an edge thereof.

(Embodiment 6)

Figure 10:
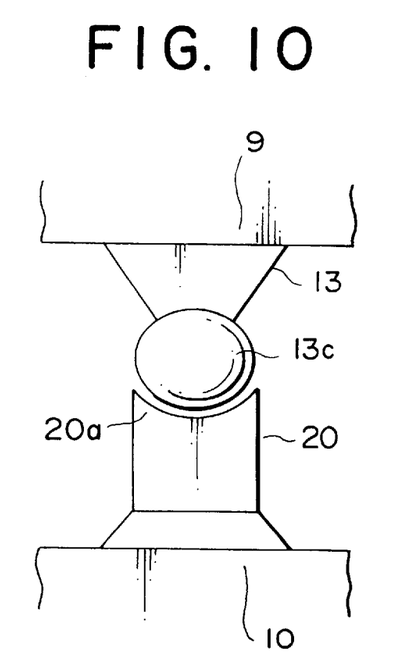
FIG. 10 is a sectional view showing the structures of a protrusion electrode terminal and a receiving terminal portion of a semiconductor device according to a sixth embodiment of the present invention.

FIG. 10 is a sectional view showing the structures of a protrusion electrode terminal 13 and a receiving terminal portion 30 of a semiconductor device according to a sixth embodiment of the present invention. The protrusion electrode terminal 13 has a circular cone portion and a sphere portion 13c formed at an edge thereof. The receiving terminal portion 20 has a cylinder portion having a concave portion 20a with the same line of curvature as the sphere portion 13c. Thus, with the concave portion 20a of the receiving terminal portion 20 and the sphere portion 13a of the protrusion electrode terminal 13, they are detachably fitted and electrically connected.

As described above, according to the semiconductor device of the present invention, since the connected portion of the semiconductor package and the mounting substrate is free of solder, it is not necessary to use an expensive facility such as a re-flow furnace. Thus, the cost of the material can be suppressed and the heating step can be omitted. In addition, with high mounting reliability, the semiconductor package can be mounted and repaired at room temperature. Moreover, the connected portion hardly deteriorates. Furthermore, since a component containing lead harmful to human bodies is not used and exhausted, the semiconductor device according to the present invention is effective from a view point of protection of environmental contamination.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

This invention is disclosed in Japanese Patent Application No. 10-337606 filed on Nov. 27, 1998, and the entire disclosure thereof is incorporated herein by reference.

What is claimed is:

1. A semiconductor device, comprising:
   (a) a semiconductor package including
      (i) a first wiring substrate having a first region and a second region, the first region having a first connecting terminal, the second region having a first external connecting terminal whose surface is coated with a conductor layer, the first external connecting terminal being connected to the first connecting terminal, and
      (ii) a semiconductor element mounted in the first region of the first wiring substrate and connected to the first connecting terminal; and
   (b) a second wiring substrate having a second external connecting terminal whose surface is coated with a conductor layer disposed opposite to the first external connecting terminal of the first wiring substrate of the semiconductor package;
   (c) wherein at least one of the first external connecting terminal and the second external connecting terminal is a protrusion electrode terminal and the other is a receiving terminal portion, and the receiving terminal portion is detachably fitted and electrically connected to the protrusion electrode terminal.

2. The semiconductor device as set forth in claim 1, wherein the receiving terminal portion has an aggregated electrode layer having a plurality of fiber electrodes that are bound or tangled.

3. The semiconductor device as set forth in claim 2,
wherein the receiving terminal portion has a multilayered electrode portion of which a plurality of aggregated electrode layers are piled up, and wherein the aggregated electrode layers of the multilayered electrode portion are fitted and electrically connected to the protrusion electrode terminals with different heights.

4. The semiconductor device as set forth in claim 1,
wherein the receiving terminal portion has a protrusion electrode terminal.

5. The semiconductor device as set forth in claim 4,
wherein the protrusion electrode terminal has a cylinder portion and a disc portion formed at an edge thereof, and wherein the receiving terminal portion has an electrode terminal whose shape is almost the same as the protrusion electrode terminal.

6. A semiconductor device, comprising:

a wiring substrate having a first region and a second region, a first connecting terminal being formed on the first region, a second connecting terminal being formed on the second region and connected to the first connecting terminal, a semiconductor element mounted in the first region of the wiring substrate and connected to the first connecting terminal, and a first connecting member adapted for connecting the second connecting terminal of the wiring substrate to an external connecting terminal of an external wiring substrate, the first connecting member being detachably fitted and electrically connected to a second connecting member disposed on the external connecting terminal of the external wiring substrate.

* * * * *